United States Patent
Haslam et al.

(10) Patent No.: US 11,829,273 B1
(45) Date of Patent: *Nov. 28, 2023

(54) MONITOR DEVICE WITH LOCAL DATA PROCESSING

(71) Applicant: United Services Automobile Association (USAA), San Antonio, TX (US)

(72) Inventors: Justin Dax Haslam, San Antonio, TX (US); Eric David Schroeder, San Antonio, TX (US)

(73) Assignee: UNITED SERVICES AUTOMOBILE ASSOCIATION (USAA), San Antonio, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/543,896

(22) Filed: Dec. 7, 2021

Related U.S. Application Data

(63) Continuation of application No. 16/889,759, filed on Jun. 1, 2020, now Pat. No. 11,221,936, which is a
(Continued)

(51) Int. Cl.
  *G06F 11/30* (2006.01)
  *G01F 15/06* (2022.01)
  (Continued)

(52) U.S. Cl.
  CPC ........ *G06F 11/3089* (2013.01); *G01F 15/063* (2013.01); *G01F 15/065* (2013.01); *G01R 31/50* (2020.01); *G06F 11/3013* (2013.01)

(58) Field of Classification Search
  CPC ............. G06F 11/3089; G06F 11/3013; G01F 15/063; G01F 15/065; G01R 31/50
  See application file for complete search history.

(56) References Cited

U.S. PATENT DOCUMENTS 9,322,667 B2 * 4/2016 Marwah .................. G01D 4/00
10,166,565 B2    1/2019 Lemkin
(Continued)

FOREIGN PATENT DOCUMENTS

EP    2177884 B1 * 10/2012 ............... F23K 5/06
GB    2524270 A  *  9/2015 ............. G06N 7/005
(Continued)

OTHER PUBLICATIONS

Coifman et al, "Estimating median velocity instead of mean velocity at single loop detectors", Transportation Research Part C 11 (2003) 211-222 (Year: 2003) ti.
(Continued)

*Primary Examiner* — Eyob Hagos
(74) *Attorney, Agent, or Firm* — Fletcher Yoder, PC

(57) ABSTRACT

A monitor device is configured to monitor a system, such as a utility system and/or appliance. The monitor device includes sensor(s) that measure characteristic(s) of the system, and data storage that stores parameter data that is provided from a remote service. The parameter data includes thresholds, signatures, and/or other information that describes a typical operational state of the system. The monitor device includes software that executes locally to compare current sensor data to the parameter data and determine whether the current operational state of the system is within the bounds of the typical state as defined by the parameter data. In instances where the current state is atypical, indicating a possible problem with the system, a notification can be sent describing the anomaly. The monitor device can also perform other action(s) to correct the problem or mitigate possible damage, and can operate autonomously if a network connection is unavailable.

20 Claims, 5 Drawing Sheets

Related U.S. Application Data continuation of application No. 15/621,486, filed on Jun. 13, 2017, now Pat. No. 10,671,502.

(51) Int. Cl.
    *G01R 31/50*      (2020.01)
    *G01F 15/063*      (2022.01)

(56) References Cited

U.S. PATENT DOCUMENTS

| | | | |
|---|---|---|---|
| 10,234,350 B1 | 3/2019 | Schroeder et al. | |
| 10,267,651 B2 | 4/2019 | Pedreiro et al. | |
| 10,508,966 B2 * | 12/2019 | Tooms | G01M 3/26 |
| 2004/0206405 A1 * | 10/2004 | Smith | E03B 7/071 |
| | | | 137/624.12 |
| 2014/0207392 A1 * | 7/2014 | Cornwall | G01D 4/00 |
| | | | 702/45 |
| 2014/0343875 A1 * | 11/2014 | Spyropoulos | G01F 1/34 |
| | | | 702/47 |
| 2015/0268062 A1 * | 9/2015 | Tang | G06N 7/01 |
| | | | 702/186 |
| 2016/0290829 A1 * | 10/2016 | Wada | G01D 4/002 |
| 2016/0335875 A1 * | 11/2016 | Alcorn | G01F 1/68 |
| 2017/0111713 A1 * | 4/2017 | Adler | G01F 15/063 |
| 2017/0184417 A1 * | 6/2017 | Pedreiro | G01D 4/002 |
| 2017/0335550 A1 * | 11/2017 | Sterling | E03B 7/072 |
| 2018/0128666 A1 * | 5/2018 | Hishinuma | G01F 3/22 |
| 2018/0316517 A1 * | 11/2018 | Henzig | G06F 11/3409 |
| 2018/0364666 A1 * | 12/2018 | Haghighat-Kashani | H04L 67/30 |

FOREIGN PATENT DOCUMENTS

| | | | | |
|---|---|---|---|---|
| WO | WO-2013075182 A1 * | 5/2013 | | G01D 4/002 |
| WO | WO-2017117030 A1 * | 7/2017 | | G01D 4/002 |
| WO | WO-2018168838 A1 * | 9/2018 | | F04B 51/00 |

OTHER PUBLICATIONS

Swart, "Correlating the switch-on time of two identical PV modules using a simplified measuring approach" 978-1-673-9749-0/16/$31.00 ©2016 IEEE (Year: 2016).

\* cited by examiner

MONITOR DEVICE WITH LOCAL DATA PROCESSING

CROSS-REFERENCE TO RELATED APPLICATIONS

This application is a continuation of U.S. patent application Ser. No. 16/889,759, filed Jun. 1, 2020, entitled "MONITOR DEVICE WITH LOCAL DATA PROCESSING", which is a continuation of U.S. patent application Ser. No. 15/621,486, filed Jun. 13, 2017, which issued on Jun. 2, 2020 as U.S. Pat. No. 10,671,502, entitled "MONITOR DEVICE WITH LOCAL DATA PROCESSING," which are hereby incorporated by reference in their entireties for all purposes.

BACKGROUND

There has been an increase in the number of appliances, devices, utility devices, mechanisms, lighting fixtures, security devices, and/or other types of devices that are available for the home or other environments, and that include data collection, computing, sensing, and/or network communication capabilities in addition to their normal functionality. These devices may be described as smart appliances, smart vehicles, smart building components, smart infrastructure components, smart home devices, and so forth, and may also be described as Internet of Things (IoT) devices. The various devices may generate data, such as sensor data, status information, and so forth, and the data may be shared among the devices over one or more wired or wireless networks using a variety of communication protocols. The data generated by the devices may be collected, analyzed, or otherwise processed by computing devices, analytic cloud based IoT platforms and/or individuals.

SUMMARY

Implementations of the present disclosure are generally directed to a monitor device for monitoring and/or controlling a system, such as a utility system. More particularly, implementations of the present disclosure are directed to a monitor device that collects sensor data describing the state of a monitored system, and that performs local data processing to perform action(s) in response to detecting particular state(s) of the system.

In general, implementations of innovative aspects of the subject matter described in this specification can be embodied in a method that includes the following actions: receiving sensor data generated by at least one sensor configured to measure at least one characteristic of a utility system, wherein the sensor data describes the at least one characteristic of a utility system; accessing parameter data that at least partly defines a typical operational state of the utility system; comparing the sensor data to the parameter data to determine that the utility system exhibits an atypical operational state and, in response, performing at least one action; sending the sensor data to at least one remote service that analyzes aggregate sensor data from the at least one sensor device to determine an updated version of the parameter data; and receiving the updated version of the parameter data from the at least one remote service.

These and other implementations can each optionally include one or more of the following innovative aspects: the sensor data is received and compared to the parameter data in real time with respect to generation of the sensor data by the at least one sensor; the sensor data is sent to the at least one remote service in real time with respect to generation of the sensor data by the at least one sensor; the updated version of the parameter data is determined based on the sensor data aggregated over a period of time; the updated version of the parameter data is received periodically according to the period of time; the parameter data includes a threshold value for a characteristic of the utility system; determining that the utility system exhibits the atypical operational state is based on the sensor data indicating that a current value of the characteristic exceeds the threshold value; the parameter data includes a signature describing a typical change, over time, of a characteristic of the utility system; determining that the utility system exhibits the atypical operational state is based on the sensor data indicating that the characteristic exhibits a change, over time, that does not correspond to the signature; the parameter data includes a median on-time table (MOTT) describing a typical change in a characteristic of the utility system; determining that the utility system exhibits the atypical operational state is based on the sensor data indicating that the characteristic exhibits a change that does not correspond to the MOTT; the at least one action includes sending a notification message to at least one recipient, the notification message describing the atypical operational state of the utility system; at least one sensor is arranged to measure at least one of a flow duration, a flow rate, or a flow volume of water within the utility system; the utility system is an appliance that receives the water; the utility system is a water distribution system that supplies the water to a plurality of appliances; the parameter data includes one or more of a threshold value for a typical flow duration, a threshold value for a typical flow rate, a threshold value for a typical flow volume, a signature of a typical flow event, and a median on-time table (MOTT) describing a typical amount of time that the water flows at a particular flow rate; and/or the at least one action includes stopping flow of the water to the utility system.

Other implementations of any of the above aspects include corresponding methods, apparatus, and/or computer programs that are configured to perform the actions of the system. The present disclosure also provides a computer-readable storage medium coupled to one or more processors and having instructions stored thereon which, when executed by the one or more processors, cause the one or more processors to perform operations in accordance with implementations of the methods provided herein. The present disclosure further provides a system for implementing the methods provided herein. The system includes one or more processors, and a computer-readable storage medium coupled to the one or more processors having instructions stored thereon which, when executed by the one or more processors, cause the one or more processors to perform operations in accordance with implementations of the methods provided herein.

The implementations described herein provide at least the following technical advantages and/or improvements compared to previously available techniques. As described herein, a monitor device receives parameter data from a remote (e.g., cloud) service, the parameter data describing and at least partly defining a typical operational state of the monitored system. Implementations provide a monitor device that performs local operations to compare the sensor data to parameter data to determine the current state of the monitored system, and to determine whether the system is operating normally, within the bounds defined by the parameter data. Because the monitor device performs the sensor data analysis locally, based on the locally stored parameter data, the monitor device is able to operate autonomously and independently of the remote (e.g., cloud) service, such as in instances when a network connection between the monitor device and the remote service is slow or unavailable or when the remote service is down. Moreover, by performing the sensor data analysis on the monitor device instead of on the remote (e.g., cloud) service, implementations reduce the processing load on the remote service that would otherwise be sustained if all processing was performed on the service. Accordingly, implementations enable a remote service that consumes less processing power, active memory, network bandwidth, and/or other computing resources than would be the case if all processing was performed on the service. In particular, implementations reduce the amount of network communications between the monitor device and the remote service, given that sensor data analysis is performed on the monitor device. Moreover, by performing the sensor data analysis locally on the monitor device instead of remotely, the monitor device can, in some instances, quickly perform action(s) such as a valve shutoff, system shutdown, and so forth. Because such action(s) can be performed without requiring a network communication round-trip to communicate with the remote service, the monitor device can respond to a problem more quickly than other monitor systems in which the data processing and response is handled solely on the server side.

Moreover, implementations provide a cost-saving measure. By performing at least some of the processing on the monitor device instead of in the cloud, implementations reduce the amount of processing time consumed in the cloud, which can reduce costs when operating in a cloud environment that charges for processing time and/or power. Implementations also reduce cost for network bandwidth if the monitor device is on a capped data plan, such as that provided by a home ISP or 4G/LTE provider. Implementations can also incorporate local data sources for analysis that are not configured to go to the cloud or, e.g., for privacy reasons, are not appropriated to be shared to the cloud. For example, occupancy in the home could be a local parameter for analysis that is stored on the monitor device, but not stored in the cloud.

It is appreciated that implementations in accordance with the present disclosure can include any combination of the aspects and features described herein. That is, implementations in accordance with the present disclosure are not limited to the combinations of aspects and features specifically described herein, but also include any other appropriate combinations of the aspects and features provided.

The details of one or more implementations of the present disclosure are set forth in the accompanying drawings and the description below. Other features and advantages of the present disclosure will be apparent from the description and drawings, and from the claims.

DETAILED DESCRIPTION

Figure 1:
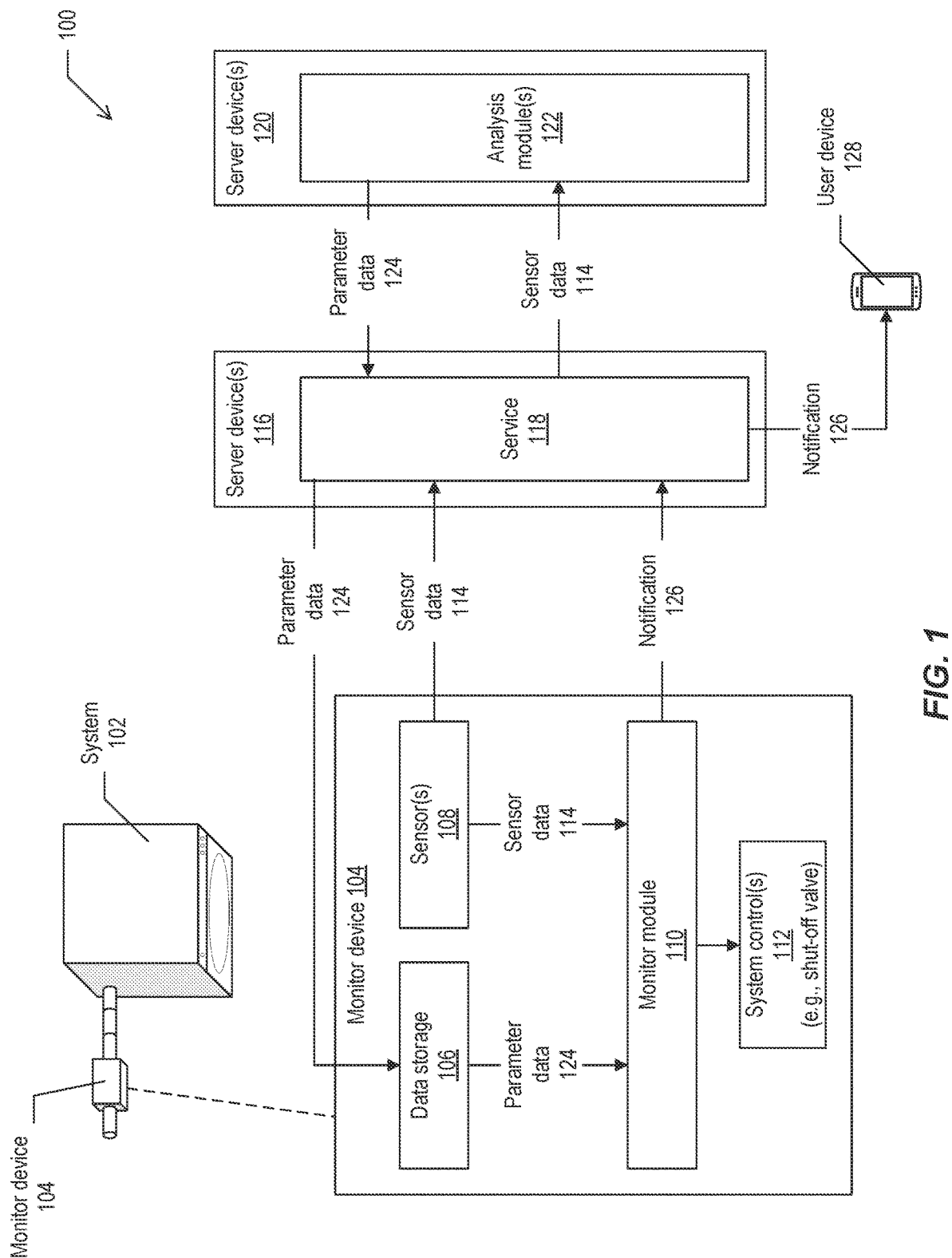
FIG. 1 depicts an example environment for system monitoring using a monitor device, according to implementations of the present disclosure.

Implementations of the present disclosure are directed to devices, methods, and computer-readable media for monitoring a system, such as a utility system, to determine whether the system is operating in a typical state. A monitor device is coupled to, incorporated into, or otherwise arranged to monitor a system. The monitor device may include one or more sensors that are configured to measure particular characteristic(s) of the monitored system. In one example, the monitored system is a water distribution system within a home or other building. As another example, the monitored system can be an appliance (e.g., dishwasher, washer, toilet, etc.) that uses water. In either example, the monitor device may be placed in-line in the water supply pipe such that sensor(s) in the monitor device can measure the water flow rate, flow volume, flow duration, temperature, pressure, chemical composition, and/or other suitable characteristics of the water flowing in the monitored system. Other examples include, but are not limited to, network bandwidth monitoring, natural gas consumption, power consumption, general smart home interaction data (light switch on/off, motion sensor trigger, etc), and so forth. The monitor device includes a local data storage that stores parameter data that is generated by a remote service, and communicated to the monitor device from the remote service. The parameter data includes thresholds, signatures, and/or other information that describe and at least partly define a typical operational state of the monitored system. A typical operational state may also be described as a normal state, an acceptable state, or an expected state, such that a problem may be inferred if the system is determined to be operating outside its typical state.

The monitor device includes local firmware or other software module(s) that execute to compare the current sensor data to the parameter data, to determine whether the current operational state of the monitored system is the typical state or outside the typical state that is defined by the parameter data. In instances where the current state is atypical, indicating a possible problem with the system, an alert or other notification may be sent to one or more individuals describing the anomalous state of the system. For example, in instances where the monitored system is a water system and/or water-using appliance, an anomalous flow rate, flow volume, and/or flow duration may indicate a leak in the system, and a notification may be sent to alert the appropriate individual(s) of the possible leak. In some instances, the monitor device can autonomously perform certain action(s) to respond to the atypical state, to attempt to address the problem and/or mitigate potential damage caused by the problem. For example, the monitor device can control a water shutoff valve that enables the device to cut off the water supply to the monitored system in response to a possible leak.

In some implementations, the parameter data the defines the typical operational state of the system may be determined based on an analysis of aggregated sensor data. The analysis may be performed by a service that is remote with respect to the monitor device. For example, the monitor device may communicate the sensor data, in real time, to the service. The service can aggregate the sensor data over a period of time (e.g., a day), and analyze the aggregate data to update the parameter data for the monitored system. The updated parameter data may then be communicated (e.g., daily) to the monitor device, which stores the parameter data locally and uses it to analyze the sensor data and detect atypical behavior of the monitored system. By storing the parameter data locally, and performing the analysis of the sensor data locally based on the locally stored parameter data, the monitor device is able to continue operating during periods of poor or non-existent network connectivity and/or during periods when the remote service is down or otherwise unavailable. Accordingly, the monitor device may be described as an autonomous or semi-autonomous monitor device that analyzes the sensor data based on the available parameter data that was most recently communicated to the monitor device.

Implementations described herein provide for a data flow and computing process between the monitor device that is embedded into, or otherwise configured to monitor, a system such as a utility system. The monitor device includes a microcontroller for local processing, data storage to store the latest parameter data received from the remote service, and one or more sensor devices to measure characteristics of the monitored system. Implementations also include a backend (e.g., cloud) service that analyzes aggregate sensor data, determines updated parameter data based on the analysis, and communicates the updated parameter data to the monitor device when a network connection is available. Implementations optimize the interactions between monitor device and the remote service to ensure optimal monitoring of the system. In some implementations, the system dynamically determines the particular way in which a notification is to be provided if a potential problem is detected. For example, the monitor device can determine whether there is currently a network connection to the cloud, and if so can send a notification (e.g., alert) via cloud channels when the network is available. The monitor device can use local channels and/or non-network dependent notification methods if the network is not available, such as providing an alert through physical devices connected to the monitor device (e.g., lights, sirens, etc.). In some implementations, optimization is provided by shifting raw data to the cloud for detailed analysis, and performing the real-time analysis locally, to minimize the analysis of large data sets on the local monitor device that may have limited processing power and/or memory.

Although some examples herein describe the monitored system as a utility system, such as a water distribution system and/or water-using appliance, implementations are not so limited. In some implementations, the monitored system is some other type of utility system. For example, the system can be an electricity distribution system in a home or other environment, including distribution panels, breakers, switches, power lines, outlets, and so forth. The system can be an appliance or other device that consumes electricity, such as a HVAC system, water heater, kitchen appliance, clothes washer and/or dryer, and so forth. In some instances, the system is a power generating system such as a system that generates electricity based on solar or geothermal energy. The monitored system can be a natural gas distribution system within a home or other environment, or an appliance that consumes natural gas such as a heater, water heater, oven, fireplace and so forth. The system may include other types of utility systems, including or not limited to communications network systems (e.g., home networks), air distribution systems (e.g., HVAC systems and/or appliances), and so forth. The system may also include smart home and/or smart building systems that control lighting, air distribution, air temperature, entertainment systems for gaming, video, audio, etc., security systems that monitor occupancy, open/closed status of doors and windows, security cameras, motion and/or heat sensors, and so forth.

FIG. 1 depicts an example environment 100 for monitoring a system 102 using a monitor device 104, according to implementations of the present disclosure. As shown in the example of FIG. 1, a system 102 is monitored by a monitor device 104 that is physically coupled to, incorporated into, embedded into, or otherwise in proximity to the monitored system 102. In the particular example shown, the monitor device 104 is located inline on a water input line to a clothes washing machine, such that the water supply passes through (and is monitored by) the monitor device 104 as it is supplied to the system 102. Implementations provide for the monitoring of other types of systems 102, as described above. In some implementations, the monitor device 104 is incorporated as a component of an appliance being monitored, and/or the monitor device 104 may be the appliance itself that is configured for self-monitoring.

The monitor device 104 includes data storage 106, one or more sensors 108, and a monitor module 110. The data storage 106 may be of any suitable size and format. The sensor(s) 108 may also be described as sensor device(s) or sensor component(s), and may be of any suitable number and type to measure the relevant characteristics of the system 102 being monitored. For example, for a monitor device 104 that measures water flow characteristics within a water distribution system or appliance(s), the sensor(s) 108 can include sensor(s) to measure flow rate, flow volume, flow duration, water temperature, water pressure, salinity or other chemical composition of the water, and so forth. As another example, for a monitor device 104 that measures electrical supply characteristics in a power distribution system and/or appliance(s), the sensor(s) can measure voltage, load, current, and so forth. The monitor module 110 may also be described as firmware, and may be executed by a microcontroller or other sort of processor included in the monitor device 104. The monitor device 104 may also include transceiver(s) configured to receive and send information over one or more networks. In some implementations, the monitor device 104 includes one or more system controls 112 that (e.g., directly) control the operation of the monitored system 102. For example, the monitor device 104 can include a shutoff valve or switch that reduces or stops the supply of water, electricity, gas, air, and/or other relevant substance to the system 102, such as an immediate response to a detected leak (e.g., water or gas) or arc/short circuit (e.g., electrical). As another example, the monitor device 104 can include a shunt, overflow line, or other mechanism to relieve excess pressure within the system 102, or dissipate excess current.

The sensor(s) 108 generate sensor data 114 that describe one or more characteristics of the monitored system 102. For example, the sensor data 114 can include one or more current measurements of flow rate, flow volume, flow duration, or other characteristics of a water-using or water-distributing system 102. The monitor module 110 can retrieve parameter data 124 that is stored in the data storage 106, and compare the current sensor data 114 to the parameter data 124 to determine whether the system 102 is currently operating is its typical (e.g., normal, acceptable) state as defined by the parameter data.

If the current system state is determined to be atypical, based on this comparison, the monitor module 110 can perform one or more actions. In some instances, the action (s) 126 include sending a notification 126 to one or more recipients, such as an alert indicating a possible problem with the system 102. In some implementations, the notification 126 is sent to the service 118 executing on the server device(s) 116, and the service 118 may send the notification 126 to one or more individuals that have been previously registered to receive notification(s) regarding the particular monitor device 104 and/or monitored system 102. In some implementations, the notification 126 may be sent directly from the monitor module 110 on the monitor device 104 to the recipient(s). The notification 126 may be sent as an email, text message, push notification, or using any other suitable messaging format and/or channel. Recipient(s) of a notification 126 may view the notification 126 through a user device 128, which may be any suitable type of computing device. The notification 126 may describe the particular system 102 being monitored, the monitor device 104 that is monitoring the system 102, and/or the atypical state and/or behavior of the system 102 that has been detected by the monitor device 104. For example, the notification 126 may indicate that a flow rate within the monitored system 102 is a particular value and/or exceeds a threshold value indicated in the parameter data 124. The action(s) performed in response to detecting an atypical system state may also include sending instructions to the system control(s) 112.

In addition to be used by the monitor module 110 to assess the current operational state of the system 102, the sensor data 114 is also communicated to a service 118 executing on one or more server devices 116. In some implementations, the sensor data 114 is received from the sensor(s) 108 in an analog format, and is converted to a digital format prior to being sent to the service 118 and/or being consumed and analyzed by the monitor module 110. The sensor data 114 may also be otherwise reformatted or pre-processed prior to being sent to the service 118 and/or monitor module 110.

The server device(s) 116 can include any suitable number and type of computing device(s). In some implementations, the server device(s) 116 are distributed computing devices or cloud servers, and the service 118 can be described as a cloud service. The service 118 may store the received sensor data 114 in (e.g., a NoSQL) data storage on the server device(s) 116, and communicate the sensor data 114 to analysis module(s) 122 executing on another one or more server device(s) 120. The server device(s) 120 can include any suitable number and type of computing device(s). In some implementations, the server device(s) 120 are distributed computing devices or cloud servers. The sensor data 114 can be communicated from the service 118 to the analysis module(s) 122 in real time as it is received, or in a periodic (e.g., daily) batch.

The analysis module(s) 122 can aggregate the sensor data 114 over a period of time (e.g., one day), and analyze the aggregated data to generate updated parameter data 124 for system 102. The parameter data 124 may be communicated to the service 118, for storage on the server device(s) 116. The service 118 may also send the updated parameter data 124 to the monitor device 104, for storage in the data storage 106. Once the parameter data 124 is updated on the monitor device 104, the monitor device 104 and/or the monitor module 110 may be instructed to restart such that the updated parameter data 124 is used to evaluate the operational state of the monitored system 102. The updating of the parameter data 124 to the monitor device 104 may be performed either through a periodic (e.g., daily) push of the parameter data 124 to the monitor device 104, and/or through a pull of the parameter data 124. In the latter case, the monitor device 104 may periodically query the service 118 to request updated parameter data 124 if updates are available, and the parameter data 124 may be sent to the monitor device 104 if an updated version of the parameter data 124 is available (e.g., that is more recent that the parameter data 124 currently stored on the monitor device 104).

In some implementations, as shown in the example of FIG. 1, the service 118 executes separately, on separate device(s), from the analysis module(s) 122. Alternatively, the service 118 and the analysis module(s) 122 may execute as a same service and/or on the same one or more server devices.

Figure 2:
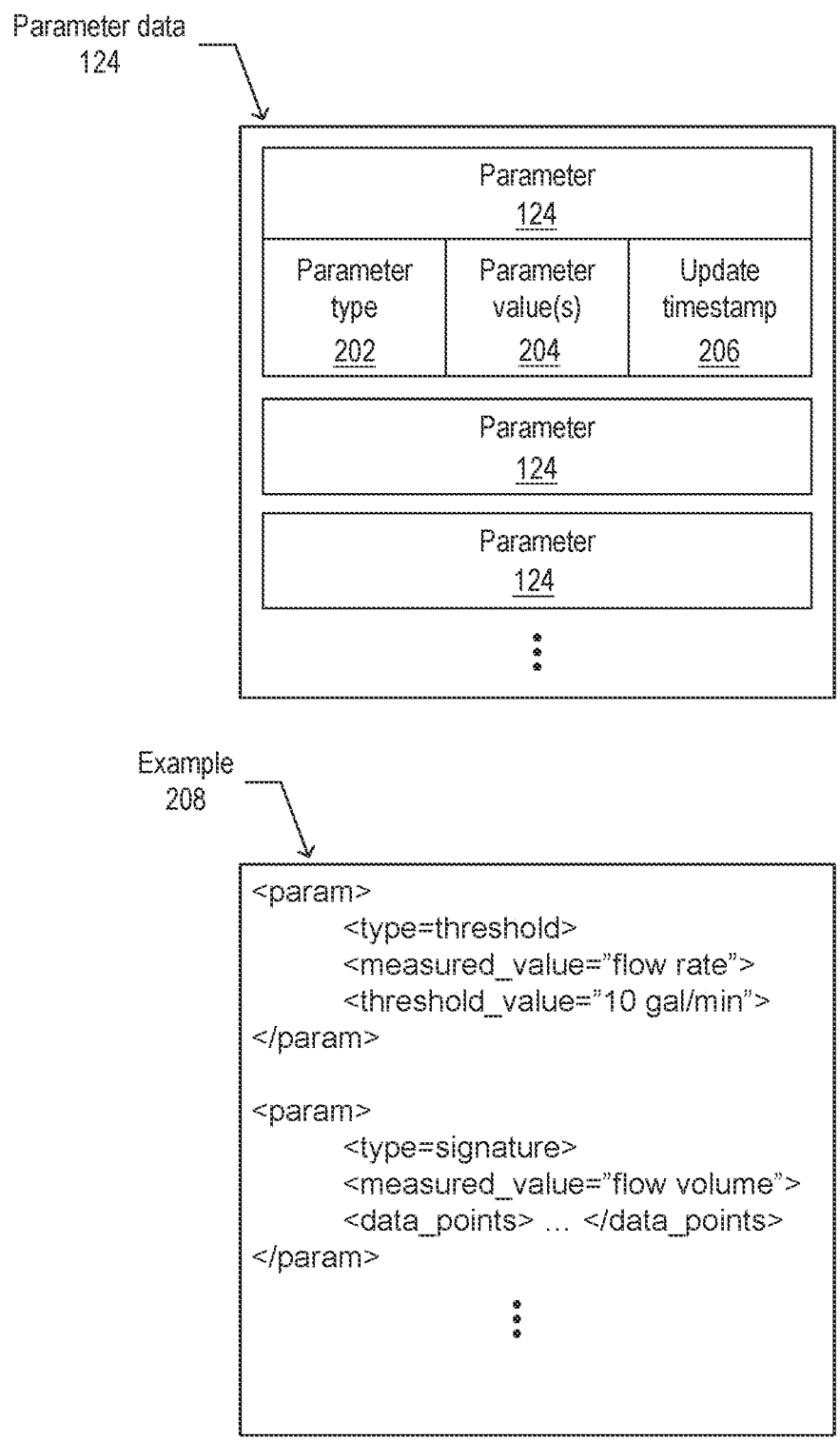
FIG. 2 depicts an example of parameter data for system monitoring, according to implementations of the present disclosure.

FIG. 2 depicts an example of parameter data 124 to be used for system monitoring, according to implementations of the present disclosure. The parameter data 124 can include any appropriate number of records, which may each be described as a parameter data record or a parameter. Each parameter 124 can describe a parameter type 204 and one or more parameter values 204. In some implementations, a parameter 124 includes an update timestamp 206 that describes a date and/or time when the parameter was generated and/or updated. FIG. 2 also includes an example 208 of the parameter data 124 described using extensible markup language (XML) or some other metadata format. Implementations also support other flat file formats, or other types of formats, to describe the parameter data 124.

A set of parameter data 124, including one or more parameters, may be associated with a particular system 102 and may provide a profile of the system 102 that describes a typical operational state of the system 102, and/or that provides boundaries that at least partly define a typical operational state of the system 102. The parameter data 124 may also be described as defining the atypical or anomalous operational state of the system 102, given that a state that is outside the parameters can be described as not typical for the system 102.

Implementations support various parameter types or categories of parameters that can be used to define the typical operational state of the system 102. A parameter 124 may be a threshold type parameter, such that the typical operational state is present when a particular measured characteristic value of the system 102 is below (or in some cases, above) a threshold value provided in the parameter 124. For example, an atypical state can be detected when a flow rate, flow volume, or flow duration of water in a system 102 exceeds a threshold value. In some implementations, the threshold value may be with respect to a particular time period. For example, an atypical state can be detected when a flow volume for a three-hour period (or other suitable time period) exceeds a threshold value for the flow volume.

A parameter 124 can be a signature type parameter. A signature may describe a profile (e.g., flow volume over time) of a particular event. An event can be associated with a particular appliance or other device, and/or with the monitored system 102 as a whole. For example, a flow event may describe a change in time in the flow of water, from a start time of zero flow to an end time of zero flow, with a time variation of positive flow exhibited between the start time and the end time. As a particular example, a toilet flush may cause a flow event that describes the flow of water to refill a toilet basin (e.g., over a one-minute period) after a flush. As another example, operation of a dishwasher may cause a flow event (e.g., over a one-hour period) that provides a signature flow pattern for a dishwashing cycle. The signatures for particular events may be associated with particular appliances or other system components, such that the signature is the signature for a particular appliance or other system component. On detecting a flow event or other type of event, the monitor module 110 may compare the profile of the event to the various signatures included in the parameter data 124, and try to find a signature parameter that matches (or is sufficiently close to) the profile of the event as described in the sensor data 114. If a match, or correspondence, is found, the behavior may be determined to be typical. If a match or correspondence cannot be found, the event may be designated as an anomalous, unknown, or unidentified event that is not associated with a known appliance signature for the system 102. In such instances, the operational state may be determined to be atypical, and action(s) may be performed accordingly.

In some implementations, the analysis module(s) 122 may analyze aggregated sensor data 114 to identify the various signatures exhibited by a system 102. The analysis may include a machine learning (ML) algorithm, such as a clustering algorithm. Through clustering, the various profiles exhibited within the sensor data 114 may be compared and clustered based on their similarity to one another, and the identified clusters may be designated as signatures to include in the parameter data 124. Each signature may describe a time variation, from an event start time to an event end time, of a particular measured characteristic of the system 102, such as a water flow volume. In some implementations, the clustering analysis is performed using a density-based spatial cluster of applications with noise (DBSCAN) algorithm, or some other suitable clustering algorithm. A high density of clusters in one particular area of the analyzed profile space may be designated as a signature to be included in the parameter data 124. Clustering may be performed using sensor data 114 aggregated over a period of time (e.g., 30 days, 60 days, etc.) to ensure an accurate and reliable identification of the various signatures within the sensor data 114 for a system 102.

A parameter 124 can be a median on-time table (MOTT) type parameter. A MOTT can track the amount of time a substance (e.g., water, gas, electricity, air, etc.) is flowing at a particular flow rate within the system 102. The MOTT provides a set of data points that describe a graph. The x-axis of the graph is time, the duration of a flow event (e.g., in seconds). The y-axis of the graph is the flow rate (e.g., ranging from zero to ten gallons per minute). For example, a typical shower use operation within a system may be to run at two gallons per minute for approximately ten minutes. As another example, a typical washing machine fill cycle may be to run for two minutes at ten gallons per minute. If the sensor data 114 exhibits behavior that is outside the expected behavior described in a MOTT, an atypical operational state is inferred and action(s) may be performed.

In some implementations, a MOTT can be visualized as a chart where flow rate is on the y-axis (e.g., vertical axis) and on-time is on the x-axis (e.g., horizontal axis). As a flow event continues, e.g., a flow event defined as a sample in between two zero flow parameters, such as a sink being turned on then turned off, a dot on the charge can be visualized as moving with time. Continuing with the example of an event in which a sink is turning on, the sink can consume 1.0 GPM (gallons per minute, a flow rate). So at the instance in time when the sink is turned on, a dot will appear on the MOTT chart at unit high on the y-axis and at 0 on the x-axis. As the sink is left on for more time, the dot will move further to the right on the x-axis. A set of parameters can then be generated for each flow rate that is the median on-time for that particular flow rate. For example, the median on-time for a washing machine (perhaps 5.0 GPM) can be shorter than a shower (e.g., 1.5-2.0 GPM). A machine learning algorithm can learn the home (or other environment), and over time is able to generate a median on-time chart for the home. When a system running at a particular flow rate exceeds the median on-time for that flow rate for the home, the monitor device sends a notification. For example, a notification can be sent if a bath tub is running more than it has in the past, someone taking a very long shower, someone leaves the sink running, or when there is a leak.

An appliance signature can be described as a flow event, e.g., defined as a point of zero flow to a point of zero flow, such as for a washing machine filling. The flow event can be visualized as a chart with flow rate on the y-axis and time on the x-axis, providing a description of how a particular water consuming appliance behaves. For example, a shower or sink may appear as a straight line, given that a user can turn it on to the preferred setting and leave it until the user is done. A washing machine or dishwasher may be a straight line as the amount of water consumed may change over time. Appliances can have distinct flow signatures from one another. For example, even two toilets of the same brand may exhibit different signatures, as there may be different lengths of water pipe to the toilets in different systems or environments. Different instances of a detected appliance flow signature for a particular appliance may look the same, or similar, when compared to each other. A density-based clustering algorithm (e.g., DBSCAN) can be used to identify the various instances of flow signatures that are similar to each other (e.g., clustered), and to designate that cluster of signatures (or an average and/or representative signature within the cluster) as the appliance signature for a particular appliance. A house or other environment can have several high density clusters of flow events, with each cluster representing an individual appliance (such as a sink, shower, toilet, ice maker, washer, dish washer, etc.). When a flow event occurs that does not correspond to one of the clusters (an unknown appliance, or potentially a leak) a notification can be sent.

Determination of the parameter data 124 on the server device(s) 120 or elsewhere is further described in U.S. Provisional Patent Application Ser. No. 62/351,427, titled "Water Flow Monitoring and Leak Detection System and Method," which was filed on Jun. 17, 2016, the entirety of which is incorporated by reference into the present disclosure.

Based on the various types of parameters, and any detected divergence of the sensor data 114 from the parameters, the monitor module 110 may infer an atypical operational state of the monitored system 102, and may perform the appropriate action(s). In some implementations, the action(s) may be configurable for a particular system 102, by the vendor of the system 102, the vendor of the monitor device 104, and/or some other party. The configuration may indicate when a notification is to be sent, the recipient(s) of the notification, and the communication channel (e.g., email, text message, etc.) to be used to send the notification. In some implementations, the configuration information is stored on the server device(s) 116 and accessible by the service 118. The monitor module 110 may send an alert to the service 118 describing the detected anomalous behavior of the monitored system 102, and the service 118 can send notification(s) in response according to the configuration information. In some implementations, the parameters 124 themselves may also be configurable, to set different thresholds, measure characteristics over different time periods, and so forth. In some instances, parameters 124 may be context-based, and may differ according to different times of day, times of the year, etc. For example, a threshold parameter may be different in the summer than in the winter, based on an expected or permissible difference in water consumption during different seasons. Appliance-based signatures may be consistent for different times of day or year, given that an appliance behavior is not expected to change based on season or time of day.

As described above, the action(s) performed in response to detecting atypical behavior may include sending notification(s) 126 and/or using system control(s) 112 to affect the monitored system 102 in some way. Other types of actions are also supported. For example, an action can include activating a camera or other sensor(s) to develop additional information regarding a potential problem with a system. As a particular example, if a flow event appears to indicate a leak in the system 102, a camera may capture video data of the area where the system 102, or the room where the possible leak would occur, and the video data may be analyzed (e.g., by trusted monitor personnel or through automated image analysis) to verify whether a leak is actually occurring.

In some implementations, the particular identity or type of monitored system 102 may be obfuscated or otherwise unknowable based on the information that the processed on the server device(s) 116 and/or 120. For example, the sensor data that is analyzed, and the parameter data that is generated, may be for a system 102 that is identified on the server(s) using a unique identifier that is not description of the type of system, such that the data on the server(s) may not be used to determine whether the particular monitored system is a toilet, dishwasher, water heater, and so forth. This obfuscation may maintain privacy, and ensure that the system behavior is profiled on the server without knowledge of what the system actually is. In some implementations, the monitor module 110 may store information that identifying the particular type of the monitored system 102, such that at least some notifications (e.g., those sent to an owner of the system) may indicate the particular system exhibiting a problem, such as a dishwasher, downstairs, toilet, master bedroom toilet, and so forth. Moreover, by doing the local analysis on the monitor device, at least some of the notifications can be kept local thus maintaining privacy.

Figure 3:
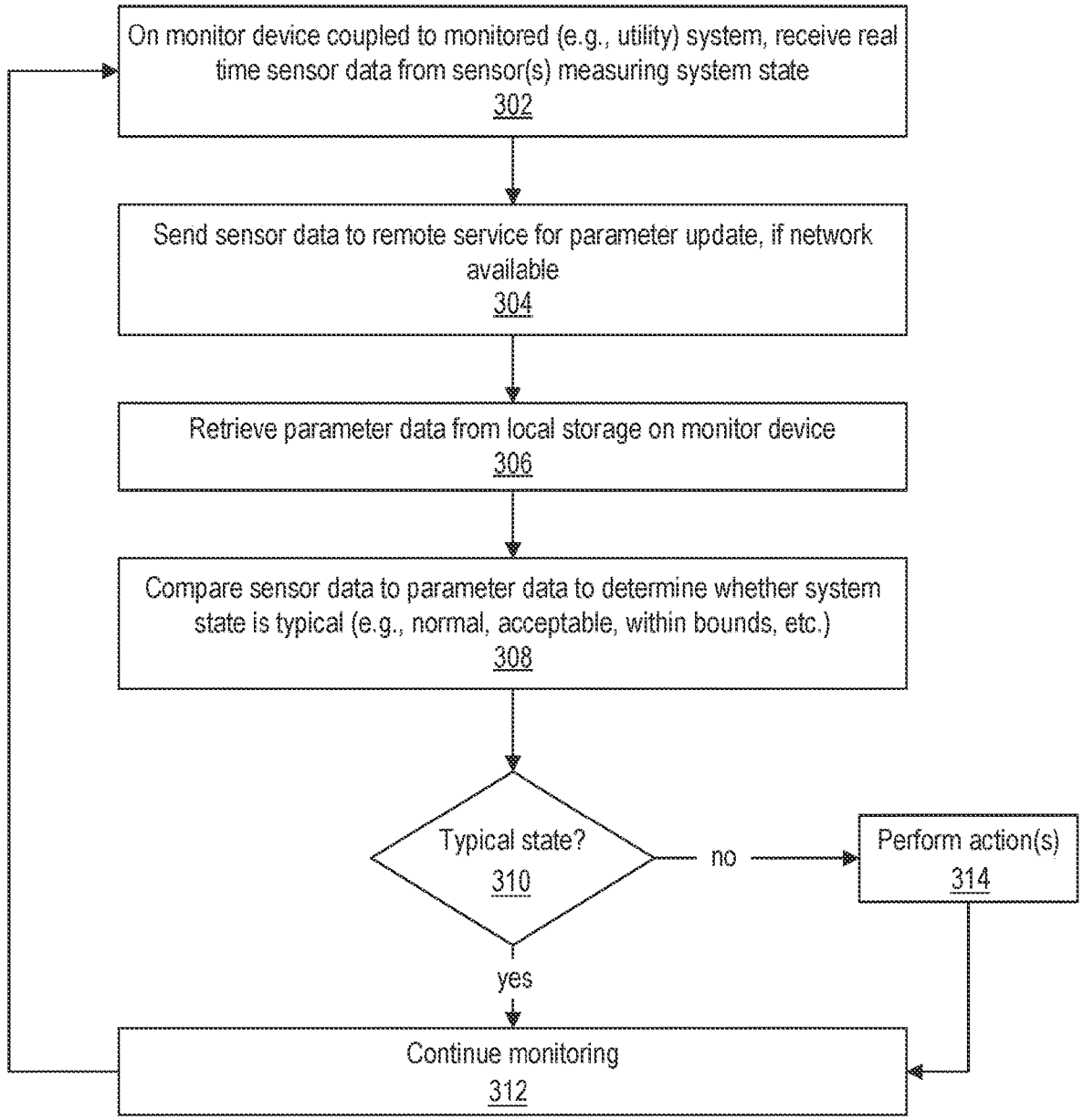
FIG. 3 depicts a flow diagram of an example process for monitoring a system, according to implementations of the present disclosure.

FIG. 3 depicts a flow diagram of an example process for monitoring a system, according to implementations of the present disclosure. Operations of the process can be performed by the monitor module 110 and/or other software executing on the monitor device 104 or elsewhere.

The sensor data 114 is received (302) by the monitor module 110 executing on the monitor device 104. As described above, the sensor data 114 may describe one or more characteristics and/or measurements of the system 102 being monitored, and thus may indicate a current state of the system 102. In some implementations, the sensor data 114 is received from the sensor(s) 108 in real time with respect to the generation of the sensor data 114 by the sensor(s) 108.

As used herein, a real time operation may describe an operation that is performed based on triggering event and without any intentional delay between the performed operation and the triggering event, taking into account the processing and/or communication limitations of the computing system(s) performing the operation and the time needed to initiate and/or perform the operation. The triggering event may be a received communication, a detection of a particular application state, another operation performed by the same or a different process, and so forth. A real time operation may also be described as a dynamic operation. Real time operations may include operations that are automatically executed in response to the triggering event without requiring human input. In some examples, a real time operation may be performed within a same execution path as a process that detects and/or handles the triggering event. For example, the real time operation may be performed or initiated by code that executes as part of the handling of the event and/or in response to a message that is sent as part of the handling of the event. A real time operation may, in at least some instances, be performed synchronously with respect to the triggering event. In some implementations, the receipt and analysis (e.g., comparison to parameters) of the sensor data 114 is performed in real time with respect to the generation of the sensor data 114 by the sensor(s) 108, such that the monitor module 110 determines whether the current operational state of the monitored system 102 is typical or atypical according to the parameter data 124.

The sensor data 114 is also sent (304) to the remote service 118, for analysis by the service 118 and/or analysis module(s) 122 to generate updated parameter data 124. The sending of the sensor data 114 to the remote service 118 can also be performed in real time with respect to the generation of the sensor data 114 by the sensor(s) 108. Alternatively, the sensor data 114 may be cached on the monitor device 104 and uploaded periodically, in batches, to the service 118 for analysis.

The most recently received parameter data 124 is retrieved (306) from the local data storage 106 on the monitor device 104. As described above, the current sensor data 114 is analyzed by comparing it to the retrieved parameter data 124, to determine whether the system 102 is currently in a typical operational state. If the current state is typical (308), no action(s) may be performed and the monitor device 104 may continue monitoring (310) the operations of the system 102. If the current state is atypical (308) (e.g., outside the bounds of expected behavior as defined by the parameter data), action(s) may be performed (312) as described above. The monitoring may then be continued (310), based on the current stream of sensor data 114.

Figure 4:
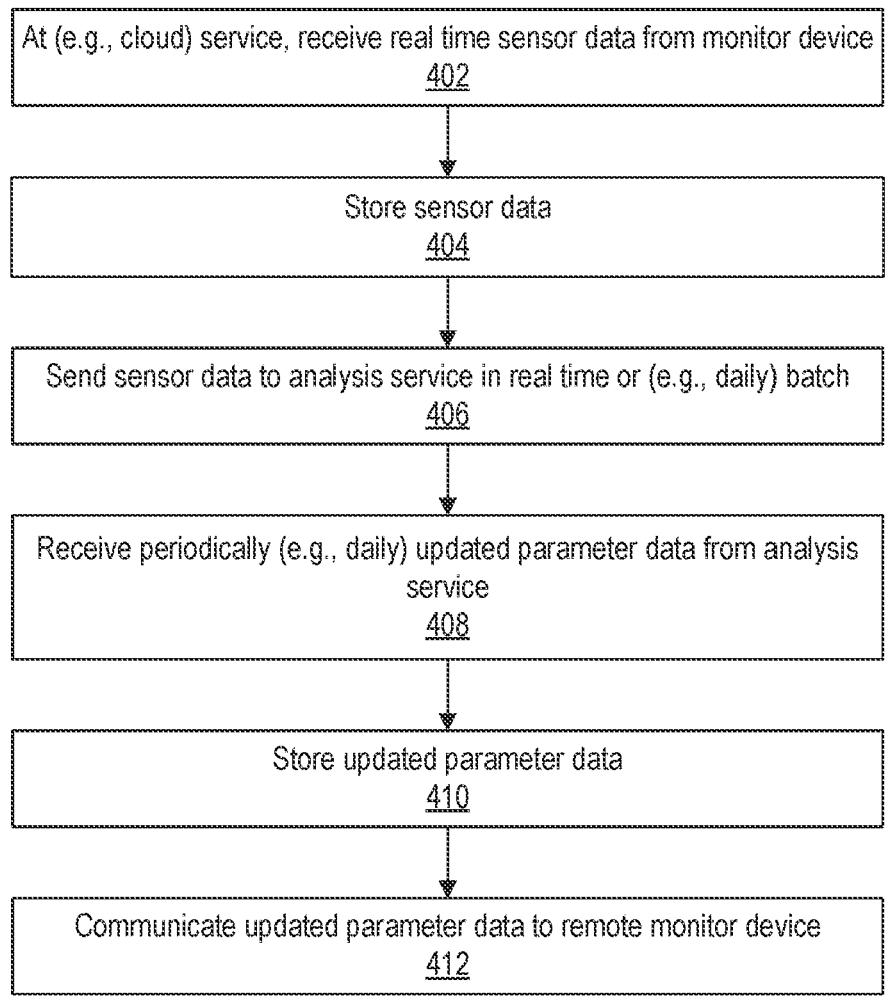
FIG. 4 depicts a flow diagram of an example process for updating parameter data, according to implementations of the present disclosure.

FIG. 4 depicts a flow diagram of an example process for updating parameter data, according to implementations of the present disclosure. Operations of the process can be performed by the service 118, the analysis module(s) 122, and/or other software executing on the server device(s) 116, the server device(s) 120, or elsewhere.

At the service 118 (e.g., a cloud service), the real time (or batched) feed of sensor data 114 is received (402) from the monitor device 104. The sensor data 114 may be stored (404) in (e.g., NoSQL) data storage on the server device(s) 116 and/or 120. The sensor data 114 may be sent (406) to the analysis module(s) 122 in real time or in a periodic (e.g., daily) batch. The analysis module(s) 122 may analyze the sensor data 114 and generate updated parameter data 124 based on the analysis. The updated parameter data 124 may be received (408) periodically (e.g., daily) from the analysis module(s) 122. The parameter data 124 may be stored (410) by the service 118 on the server device(s) 116, and sent (412) to the monitor device 104 for storage and use in analyzing the current sensor data 114.

Figure 5:
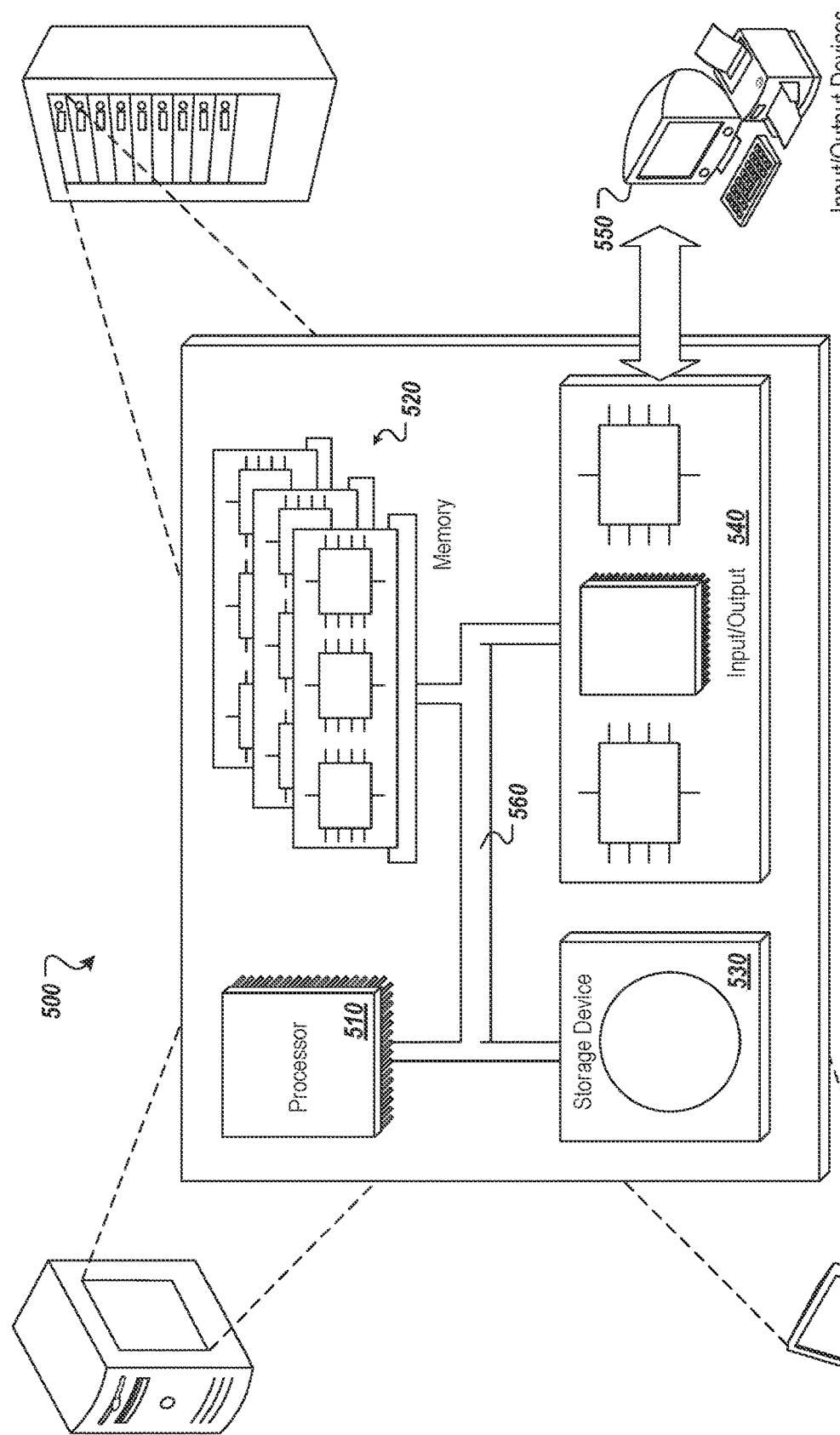
FIG. 5 depicts an example computing system, according to implementations of the present disclosure.

FIG. 5 depicts an example computing system, according to implementations of the present disclosure. The system 500 may be used for any of the operations described with respect to the various implementations discussed herein. For example, the system 500 may be included, at least in part, in one or more of the system 102, the monitor device 104, the server device(s) 116, the server device(s) 120, the user device 128, and/or other computing device(s) or computing system(s) described herein. The system 500 may include one or more processors 510, a memory 520, one or more storage devices 530, and one or more input/output (I/O) devices 550 controllable via one or more I/O interfaces 540. The various components 510, 520, 530, 540, or 550 may be interconnected via at least one system bus 560, which may enable the transfer of data between the various modules and components of the system 500.

The processor(s) 510 may be configured to process instructions for execution within the system 500. The processor(s) 510 may include single-threaded processor(s), multi-threaded processor(s), or both. The processor(s) 510 may be configured to process instructions stored in the memory 520 or on the storage device(s) 530. For example, the processor(s) 510 may execute instructions for the various software module(s) described herein. The processor(s) 510 may include hardware-based processor(s) each including one or more cores. The processor(s) 510 may include general purpose processor(s), special purpose processor(s), or both.

The memory 520 may store information within the system 500. In some implementations, the memory 520 includes one or more computer-readable media. The memory 520 may include any number of volatile memory units, any number of non-volatile memory units, or both volatile and non-volatile memory units. The memory 520 may include read-only memory, random access memory, or both. In some examples, the memory 520 may be employed as active or physical memory by one or more executing software modules.

The storage device(s) 530 may be configured to provide (e.g., persistent) mass storage for the system 500. In some implementations, the storage device(s) 530 may include one or more computer-readable media. For example, the storage device(s) 530 may include a floppy disk device, a hard disk device, an optical disk device, or a tape device. The storage device(s) 530 may include read-only memory, random access memory, or both. The storage device(s) 530 may include one or more of an internal hard drive, an external hard drive, or a removable drive.

One or both of the memory 520 or the storage device(s) 530 may include one or more computer-readable storage media (CRSM). The CRSM may include one or more of an electronic storage medium, a magnetic storage medium, an optical storage medium, a magneto-optical storage medium, a quantum storage medium, a mechanical computer storage medium, and so forth. The CRSM may provide storage of computer-readable instructions describing data structures, processes, applications, programs, other modules, or other data for the operation of the system 500. In some implementations, the CRSM may include a data store that provides storage of computer-readable instructions or other information in a non-transitory format. The CRSM may be incorporated into the system 500 or may be external with respect to the system 500. The CRSM may include read-only memory, random access memory, or both. One or more CRSM suitable for tangibly embodying computer program instructions and data may include any type of non-volatile memory, including but not limited to: semiconductor memory devices, such as EPROM, EEPROM, and flash memory devices; magnetic disks such as internal hard disks and removable disks; magneto-optical disks; and CD-ROM and DVD-ROM disks. In some examples, the processor(s) 510 and the memory 520 may be supplemented by, or incorporated into, one or more application-specific integrated circuits (ASICs).

The system 500 may include one or more I/O devices 550. The I/O device(s) 550 may include one or more input devices such as a keyboard, a mouse, a pen, a game controller, a touch input device, an audio input device (e.g., a microphone), a gestural input device, a haptic input device, an image or video capture device (e.g., a camera), or other devices. In some examples, the I/O device(s) 550 may also include one or more output devices such as a display, LED(s), an audio output device (e.g., a speaker), a printer, a haptic output device, and so forth. The I/O device(s) 550 may be physically incorporated in one or more computing devices of the system 500, or may be external with respect to one or more computing devices of the system 500.

The system 500 may include one or more I/O interfaces 540 to enable components or modules of the system 500 to control, interface with, or otherwise communicate with the I/O device(s) 550. The I/O interface(s) 540 may enable information to be transferred in or out of the system 500, or between components of the system 500, through serial communication, parallel communication, or other types of communication. For example, the I/O interface(s) 540 may comply with a version of the RS-232 standard for serial ports, or with a version of the IEEE 1284 standard for parallel ports. As another example, the I/O interface(s) 540 may be configured to provide a connection over Universal Serial Bus (USB) or Ethernet. In some examples, the I/O interface(s) 540 may be configured to provide a serial connection that is compliant with a version of the IEEE 1394 standard.

The I/O interface(s) 540 may also include one or more network interfaces that enable communications between computing devices in the system 500, or between the system 500 and other network-connected computing systems. The network interface(s) may include one or more network interface controllers (NICs) or other types of transceiver devices configured to send and receive communications over one or more communication networks using any network protocol.

Computing devices of the system 500 may communicate with one another, or with other computing devices, using one or more communication networks. Such communication networks may include public networks such as the internet, private networks such as an institutional or personal intranet, or any combination of private and public networks. The communication networks may include any type of wired or wireless network, including but not limited to local area networks (LANs), wide area networks (WANs), wireless WANs (WWANs), wireless LANs (WLANs), mobile communications networks (e.g., 3G, 4G, Edge, etc.), and so forth. In some implementations, the communications between computing devices may be encrypted or otherwise secured. For example, communications may employ one or more public or private cryptographic keys, ciphers, digital certificates, or other credentials supported by a security protocol, such as any version of the Secure Sockets Layer (SSL) or the Transport Layer Security (TLS) protocol.

The system 500 may include any number of computing devices of any type. The computing device(s) may include, but are not limited to: a personal computer, a smartphone, a tablet computer, a wearable computer, an implanted computer, a mobile gaming device, an electronic book reader, an automotive computer, a desktop computer, a laptop computer, a notebook computer, a game console, a home entertainment device, a network computer, a server computer, a mainframe computer, a distributed computing device (e.g., a cloud computing device), a microcomputer, a system on a chip (SoC), a system in a package (SiP), and so forth. Although examples herein may describe computing device(s) as physical device(s), implementations are not so limited. In some examples, a computing device may include one or more of a virtual computing environment, a hypervisor, an emulation, or a virtual machine executing on one or more physical computing devices. In some examples, two or more computing devices may include a cluster, cloud, farm, or other grouping of multiple devices that coordinate operations to provide load balancing, failover support, parallel processing capabilities, shared storage resources, shared networking capabilities, or other aspects.

Implementations and all of the functional operations described in this specification may be realized in digital electronic circuitry, or in computer software, firmware, or hardware, including the structures disclosed in this specification and their structural equivalents, or in combinations of one or more of them. Implementations may be realized as one or more computer program products, i.e., one or more modules of computer program instructions encoded on a computer readable medium for execution by, or to control the operation of, data processing apparatus. The computer readable medium may be a machine-readable storage device, a machine-readable storage substrate, a memory device, a composition of matter effecting a machine-readable propagated signal, or a combination of one or more of them. The term "computing system" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any appropriate form of programming language, including compiled or interpreted languages, and it may be deployed in any appropriate form, including as a standalone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any appropriate kind of digital computer. Generally, a processor may receive instructions and data from a read only memory or a random access memory or both. Elements of a computer can include a processor for performing instructions and one or more memory devices for storing instructions and data. Generally, a computer may also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in, special purpose logic circuitry.

To provide for interaction with a user, implementations may be realized on a computer having a display device, e.g., a CRT (cathode ray tube) or LCD (liquid crystal display) monitor, for displaying information to the user and a keyboard and a pointing device, e.g., a mouse or a trackball, by which the user may provide input to the computer. Other kinds of devices may be used to provide for interaction with a user as well; for example, feedback provided to the user may be any appropriate form of sensory feedback, e.g., visual feedback, auditory feedback, or tactile feedback; and input from the user may be received in any appropriate form, including acoustic, speech, or tactile input.

Implementations may be realized in a computing system that includes a back end component, e.g., as a data server, or that includes a middleware component, e.g., an application server, or that includes a front end component, e.g., a client computer having a graphical user interface or a web browser through which a user may interact with an implementation, or any appropriate combination of one or more such back end, middleware, or front end components. The components of the system may be interconnected by any appropriate form or medium of digital data communication, e.g., a communication network. Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the disclosure or of what may be claimed, but rather as descriptions of features specific to particular implementations. Certain features that are described in this specification in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some examples be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products.

A number of implementations have been described. Nevertheless, it will be understood that various modifications may be made without departing from the spirit and scope of the disclosure. For example, various forms of the flows shown above may be used, with steps re-ordered, added, or removed. Accordingly, other implementations are within the scope of the following claims.

The invention claimed is:

1. A utility monitoring system, comprising:
   at least one sensor configured to generate sensor data indicative of at least one operational characteristic of a utility system;
   a processor communicatively coupled to the at least one sensor; and
   a memory communicatively coupled to the processor, the memory storing:
   one or more median on-time tables configured to correlate the at least one operational characteristic of the utility system to a plurality of operational states of the utility system, wherein the one or more median on-time tables store a threshold value associated with the at least one operational characteristic of the utility system; and
   instructions which, when executed by the processor, cause the processor to:
   determine that the utility system exhibits a non-operational state based on comparing the sensor data indicative of the at least one operational characteristic of the utility system to the threshold value; and
   in response to determining that the utility system exhibits the non-operational state, initiate an action with respect to the utility system.

2. The utility monitoring system of claim 1, wherein the instructions cause the processor to execute a machine learning algorithm to generate the one or more median on-time tables for the utility system based on previous data of the utility system.

3. The utility monitoring system of claim 1, wherein the at least one operational characteristic comprises a flow duration, a flow rate, or a flow volume, or any combination thereof, of a resource within the utility system.

4. The utility monitoring system of claim 1, wherein the utility system comprises an appliance that receives a resource from the utility system.

5. The utility monitoring system of claim 1, wherein the action includes stopping flow of a resource to the utility system.

6. The utility monitoring system of claim 1, wherein the instructions cause the processor to:
   send the sensor data to an analysis system, wherein the analysis system is configured to generate one or more updated median on-time tables based on the sensor data exhibiting the non-operational state; and
   store the one or more updated median on-time tables received from the analysis system.

7. The utility monitoring system of claim 6, wherein the instructions cause the processor to:
   receive second sensor data generated by the at least one sensor; and
   analyze the second sensor data using the one or more updated median on-time tables.

8. The utility monitoring system of claim 1, wherein the utility system comprises a water distribution system configured to monitor one or more characteristics of one or more water flows moving through the water distribution system.

9. The utility monitoring system of claim 1, wherein the utility system comprises a network bandwidth monitoring system configured to monitor one or more characteristics of a network.

10. The utility monitoring system of claim 1, wherein the utility system comprises a natural gas monitoring system configured to monitor one or more characteristics of one or more gases moving through the natural gas monitoring system.

11. A method comprising:
    receiving, via at least one processor, sensor data from at least one sensor, wherein the sensor data is indicative of at least one operational characteristic of a utility system;
    storing, via a memory, one or more median on-time tables configured to correlate the at least one operational characteristic of the utility system to a plurality of operational states of the utility system, wherein the one or more median on-time tables store a threshold value associated with the at least one operational characteristic of the utility system;
    determining, via the at least one processor, that the utility system exhibits a non-operational state based on comparing the sensor data from the at least one sensor to the threshold value; and
    in response to determining that the utility system exhibits the non-operational state, initiating at least one action with respect to the utility system.

12. The method of claim 11, comprising:
    sending, via the at least one processor, the sensor data to at least one remote service in response to determining that the utility system exhibits the non-operational state, wherein the at least one remote service is configured to analyze aggregate sensor data from the at least one sensor to update the one or more median on-time tables as one or more updated median on-time tables; and
    storing, via the at least one processor, the one or more updated median on-time tables from the at least one remote service.

13. The method of claim 11, wherein the utility system is an electricity distribution utility system.

14. The method of claim 13, wherein the at least one action comprises stopping flow of electricity to the electricity distribution utility system.

15. The method of claim 13, comprising measuring at least one of a usage duration, a usage rate, or a usage volume, or any combination thereof, of electricity within the electricity distribution utility system.

16. The method of claim 11, comprising executing a machine learning algorithm to generate the one or more median on-time tables for the utility system based on previous data of the utility system.

17. One or more non-transitory computer-readable storage media storing instructions which, when executed, cause at least one processor to:
- receive sensor data from at least one sensor being indicative of at least one operational characteristic of a utility system;
- determine that the utility system exhibits a non-operational state of a plurality of non-operational states based on the sensor data exceeding a threshold value stored in one or more median on-time tables, wherein the one or more median on-time tables are configured to correlate the at least one operational characteristic of the utility system to the plurality of non-operational states of the utility system; and
- in response to determining that the utility system exhibits the non-operational state, initiate an action with respect to the utility system.

18. The one or more non-transitory computer-readable storage media of claim 17, storing instructions which, when executed, cause the at least one processor to execute a machine learning algorithm to generate the one or more median on-time tables for the utility system based on previous data of the utility system.

19. The one or more non-transitory computer-readable storage media of claim 17, storing instructions which, when executed, cause the at least one processor to send the sensor data to at least one remote service that analyzes aggregate sensor data from the at least one sensor to update the one or more median on-time tables as one or more updated median on-time tables.

20. The one or more non-transitory computer-readable storage media of claim 17, wherein the action includes stopping flow of a resource to the utility system.

\* \* \* \* \*